United States Patent [19]

Stockham

[11] Patent Number: 5,054,680

[45] Date of Patent: Oct. 8, 1991

[54] BONDING ELECTRICAL CONDUCTORS

[75] Inventor: Norman R. Stockham, Sawston, England

[73] Assignee: The Welding Institute, Cambridge, England

[21] Appl. No.: 550,382

[22] Filed: Jul. 10, 1990

[30] Foreign Application Priority Data

Jul. 11, 1989 [GB] United Kingdom ............... 8915816

[51] Int. Cl.⁵ ........................................... H01L 21/66
[52] U.S. Cl. ..................................... 228/104; 228/179
[58] Field of Search ............ 228/103, 104, 179, 180.2, 228/4.5; 29/423

[56] References Cited

U.S. PATENT DOCUMENTS 4,441,248 4/1984 Sherman et al. .................... 228/104
4,979,663 12/1990 Sofia et al. ....................... 228/180.2

FOREIGN PATENT DOCUMENTS 266208 3/1989 German Democratic Rep. ................................. 228/104

Primary Examiner—Samuel M. Heinrich
Attorney, Agent, or Firm—Martin Novack

[57] ABSTRACT

A method of bonding an electrical conductor to a contact of an integrated circuit (IC) device comprises bonding the conductor to a support member and to a contact of the IC device. The conductor is then severed to release the IC device and conductor from the support. This allows the IC device to be tested while connected to the support member and provides it with a conductor lead for connection to a carrier for use.

9 Claims, 6 Drawing Sheets x 30 x 320

BONDING ELECTRICAL CONDUCTORS

FIELD OF THE INVENTION

The invention relates to the bonding of electrical conductors to integrated circuit devices, for example in the manufacture of semiconductor devices and in particular to a new method for attaching leads to an integrated circuit chip.

DESCRIPTION OF THE PRIOR ART

Ultrasonic bonding of fine wires is well-known, such as wedge bonding in which an ultrasonic head containing a welding tool 1 (FIG. 1) feeding the wire 2 makes a first joint on a suitable prepared metallised pad 3 on a silicon chip 4. (FIG. 1 $b(1)$ and $b(2)$). The tool head 1 is moved relative to the chip (FIG. 1$b(3)$ and $b(4)$) to pull out a length of wire 2 and make a second joint to a suitable prepared metallised pad 5 or an external circuit track (FIG. 1$b(5)$). This latter joint is sufficiently strong and the wire 2 sufficiently deformed for the wire to be broken off at this point (FIG. 1 $b(6)$) in preparation for a subsequent wire connection from the silicon chip.

In an alternative arrangement known as ball-bonding the wire passes coaxially through the welding tool 7 (FIG. 2) and subsequently a ball 8 is formed on the end of the wire 9 by melting. Typically the ball diameter is twice the wire diameter. This is then pressed into contact with the metallisation 10 on the silicon chip 11 to produce a bond at a suitable elevated temperature or by the application of ultrasonic energy. This particular arrangement has the advantage that the wire can be led off in any direction (since the ball bond is symmetrical about the axis of the wire) with a subsequent capillary wedge bond external to the chip on to the appropriate circuit track. The disadvantage of ball bonding is that the ball is deformed and typically extends over some four wire diameters. This, as illustrated in FIG. 2B, limits the minimum spacing that can be utilised between the metallised pads which typically are some 100×100 micron with centers spaced 200 micron, FIG. 2A. Reducing the pad size to, say 50 ×50 micron with 100 micron centre spacing, FIG. 2B, leads to potential overlap and shorting between adjacent ball bonds. Also due to the relative flexibility of wires there is the possibility of vibration causing damage to individual wires or shorting between wire pairs. Moreover, for very high frequency devices the wires represent significant inductance.

Another method of manufacture which has been known for about 20 years is so-called tape automatic bonding (TAB). Here the electrical connections are etched in a foil which in turn is bonded to the metallised pads on the silicon chip. This is intended to allow mass production with close proximity of leads and with all the bonds made in a single operation. The tape comprises either a plain etched metal foil, or alternatively an etched metallised layer attached to a plastic film which acts as a carrier, or thirdly the etched metallised layer in conjunction with an adhesive which is carried on the plastic tape. Although this technique has been known for a long time its industrial use has not progressed markedly for two main reasons. Firstly, it is difficult to ensure adequate bonding between the etched foil or metallised tape and the silicon chip without the addition of projections or bumps either on the metallised pads of the chip or of the tracks in the tape. These bumps make up for errors in flatness of the tape with respect to the chip and in particular allow the metallic surfaces to contact each other in spite of further passivation layers 12 on the chip, see FIG. 2A. Typically, additional metallisation layers are deposited on the chip to produce a bump which rises above the passivation layer 12 to allow adequate access. Thus, chips have to be specially manufactured to take advantage of the TAB process. Also, the TAB process is ideally suited to mass production since very large numbers of lead arrays can be printed or etched on a reel of tape. However, this is a disadvantage in development and for production runs of specialised components since the whole etching procedure and associated welding operations have to be matched for the particular device concerned. Furthermore, the tape is expensive and has to be designed for each device.

SUMMARY OF THE INVENTION

In accordance with the present invention, a method of bonding an electrical conductor to a contact of an integrated circuit device comprises bonding a conductor to a support member and to a contact of an integrated circuit device; and subsequently severing the bonded conductor to release the integrated circuit device and the bonded conductor from the conductor support member.

With this invention, the device is temporarily connected to the support member to allow testing to be performed. The support member is then separated from the device leaving a free end of the conductor which can be permanently bonded to a final carrier.

Typically, the integrated circuit device will comprise a silicon chip although other devices could also be used. The conductor may be in the form of a wire or ribbon.

In a first preferred method temporary bonds are first made for a standard connector wire (or preferably rectangular ribbon) to a support member constituting an intermediary substrate for handling purposes and the free end subsequently joined to an IC chip using a wedge bonding machine for the wire or ribbon. These latter bonds are such that the wire or ribbon can be readily broken off beyond the joint to the chip, and in a further operation the connector lead again temporarily bonded to a new site on the support member for the next connection to the chip.

In a second method permanent connections are made to a silicon chip by standard wire (or preferably rectangular ribbon) using a wedge bonding machine with the wire or ribbon subsequently being bonded to a support member constituting an intermediary substrate for handling purposes. Thus, a first bond is made on the silicon chip and the second temporary bond or attachment is accomplished between the connecting lead and the temporary substrate or support member (carrier). It should be noted that the bonds to the temporary support do not have to be of high integrity in the long term but only sufficiently strong to enable the wire or ribbon to be readily broken following this second (temporary) attachment to the carrier substrate.

The (temporary) bonds on the intermediary substrate or support member can if necessary be reinforced by bonding a cap or lid to entrap the wires or preferably ribbons on to the intermediary substrate. Again, since only a limited mechanical strength is required for these temporary connections, even grossly dissimilar plastics may be utilised for the cap and support member. Although the support member may comprise a thin metal foil to which the wire or ribbon is attached, it is preferable to arrange for testing the chip at this stage of construction. For this purpose the wire or ribbon is either bonded to the metal carrier via an adhesive which acts as an insulant, or alternatively the wire or ribbon is bonded to a suitable non-conducting carrier such as a plastic.

The interconnecting conductors or leads are preferably in the form of rectangular ribbons as this provides greater rigidity against vibration and also improves the high frequency performance, for example for microwave devices. Furthermore, with ultrasonic wedge bonding the deformation of ribbons leads to relatively less spread at the point of connection.

Depending on application, there are alternative procedures envisaged. For example, the chip with its interconnecting leads may be encapsulated with a suitable plastic lid and base and the connecting leads subsequently severed from the temporary substrate. The plastic packaging provides a suitable seal and allows the chip with its associated leads to be handled for subsequent manufacturing operation. It is noted that the encapsulation does not bear on the chip but in particular is in contact with the wires or ribbons alone. This avoids the effects of contamination or mechanical stress on the electrical characteristics of the chip. Suitable plastics include short glass reinforced polyarylamide (PAM) or alternatively for a higher integrity moisture-resistant package, an aromatic polyester such as LCP or a polyphenylene sulphide, PPS, which can be ultrasonically joined together with good mechanical strength and adequate moisture-resistant properties. Standard ultrasonic compressive bonding machines are readily utilised with frequencies in the range of 20–40 kHz.

Alternatively, the connecting leads from the chip (after severing from the support member) may be bonded to suitable tracks or metallised contacts on further substrates or printed circuit boards for system networks such as large-scale integrated circuits. In one method the interconnecting leads are individually severed from the temporary or intermediary substrate and wire bonded to a circuit track on the principal substrate. This outer lead bond is made by conventional techniques such as ultrasonic or hot pressure wedge bonding or reflow soldering. This results in a chip with wire or preferably ribbon connections between its metallised contacts and an external circuit system, with the intermediate temporary substrate for purposes of handling and pretesting the chip before mounting in a board or substrate.

A further advantage of this procedure is that the material and dimension of the ribbon and the positions of the connections can be altered freely to suit the application using, for example, aluminium connecting leads for silicon devices which typically have aluminium metallised connection pads, or alternatively gold leads for gallium arsenide devices which are provided with gold metallisation connections. Plated wires or ribbons may also be used to allow solder connections to be made to the metallised connection pads or subsequent attachment to a printed circuit board or substrate, for example tin or lead-tin plated Cu. Also, the intermediary or temporary substrate can be of any suitable material sufficient for handling purposes, such as sprocketed tape or metallic foil. Note the latter needs to be coated with a suitable insulation layer if the connecting leads from the chip are to be electrically tested before the chip is joined to a further circuitry. The length of connecting lead can be varied according to application and may be at one extreme less than 1 mm or alternatively at the other extreme greater than 5 mm in extent. Equally, the connecting leads may be of any size from, say, 4–500$\mu$ in diameter, or as ribbon 5–500$\mu$ width.

BRIEF DESCRIPTION OF THE DRAWINGS

Some examples of known bonding techniques and a technique according to the invention are illustrate in the accompanying drawings, in which.

DETAILED DESCRIPTION OF THE EMBODIMENTS

Figure 1A:
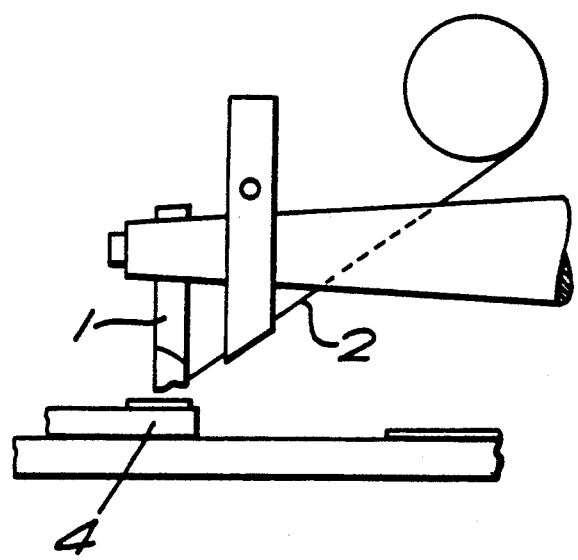
FIGS. 1a and 1b(1)–1b(6) illustrates conventional ultrasonic wedge bonding.
Figure 1B:
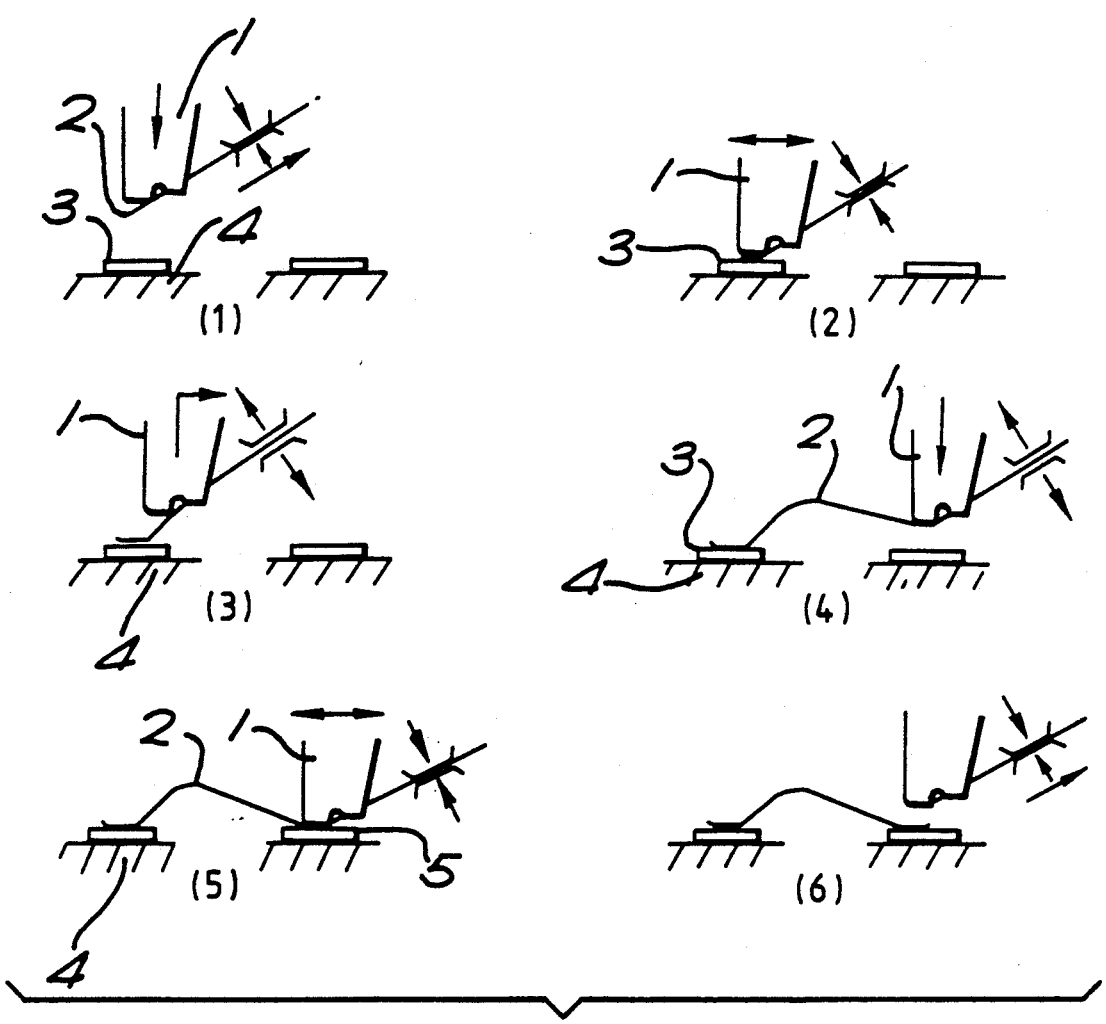
Figure 2A:
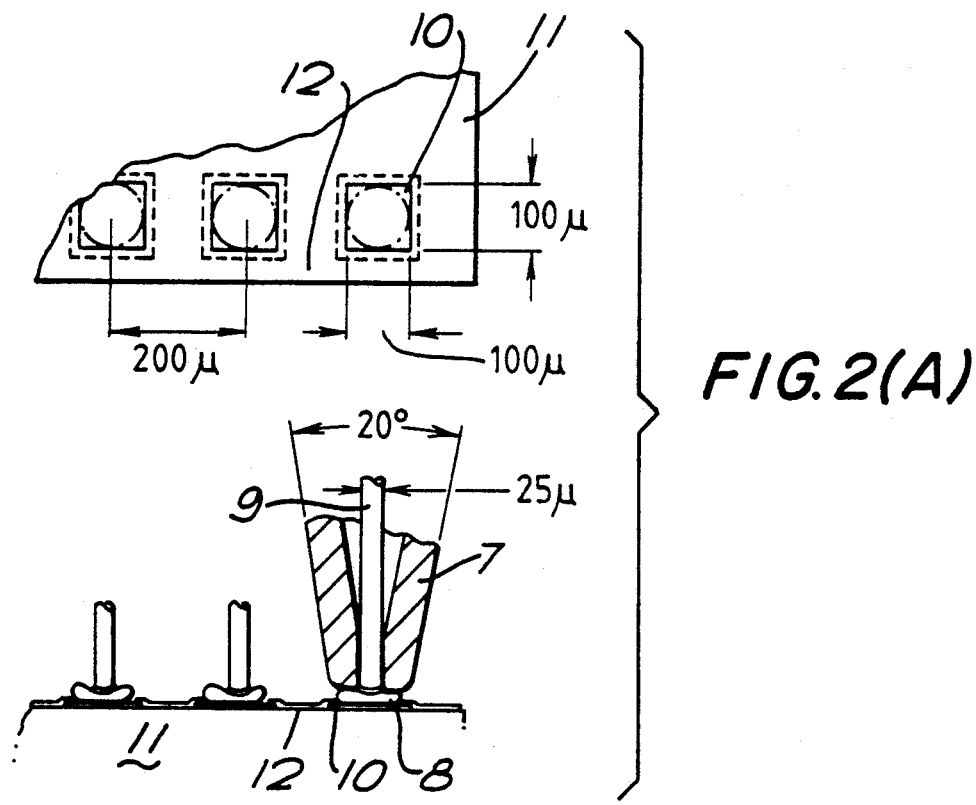
FIGS. 2A and 2B illustrates conventional ball bonding.
Figure 2B:
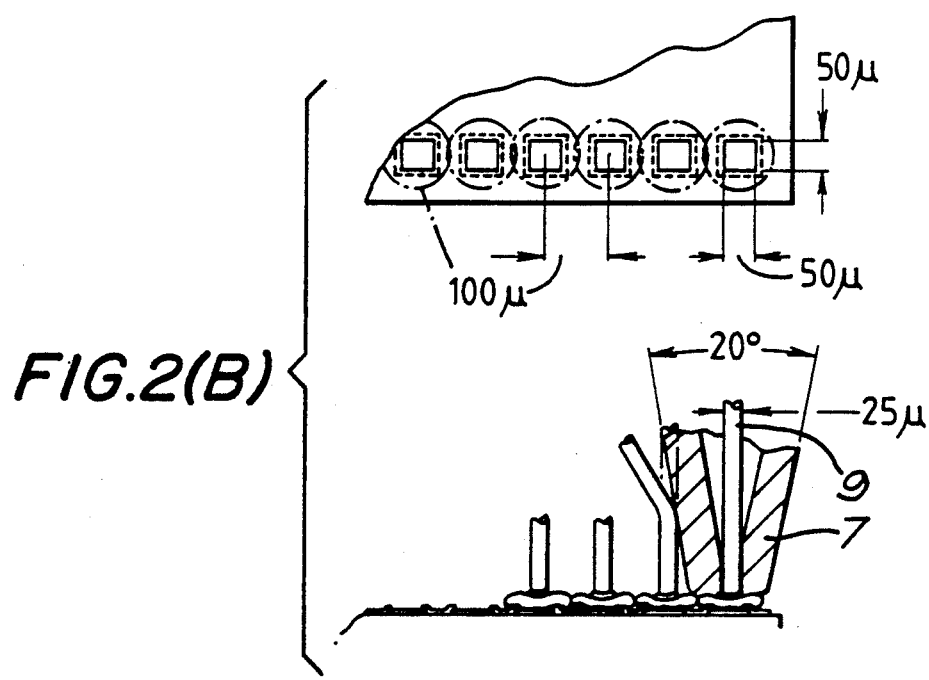
Figure 3:
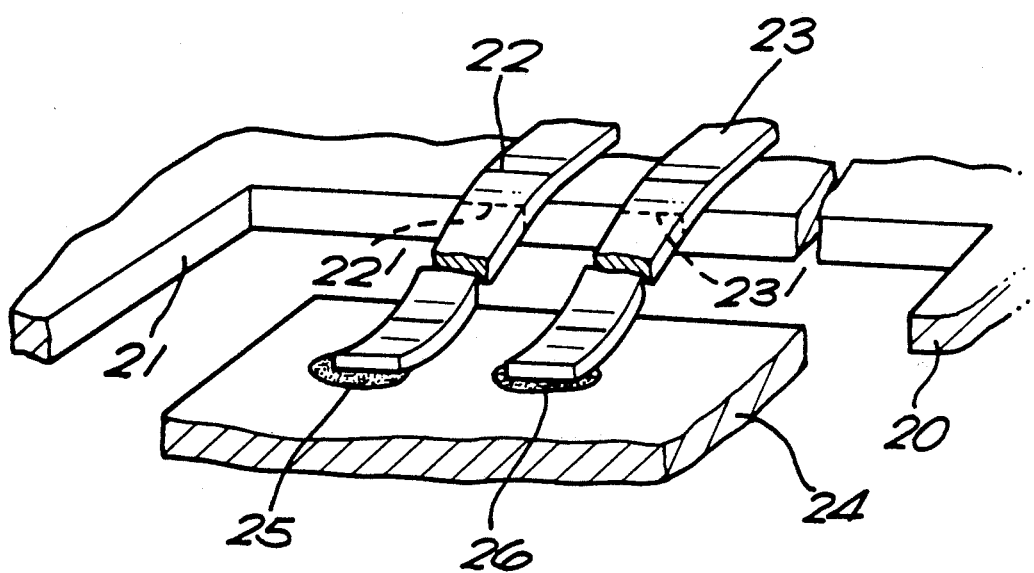
FIG. 3 illustrates diagrammatically the result of performing a method according to the invention.

FIG. 3 illustrates a support member 20 defining a window 21. The support member 20 may be made of plastics or metal as explained above and a pair of electrically conductive ribbons 22, 23, for example Au, Al or Cu, are bonded to the support member 20. In use, a silicon chip 24 having contacts 25, 26 is aligned with the bond positions on the support member and the ribbons are attached sequentially with ribbon 22 being first bonded to the support member 20 and then to contact 25 using the wire wedge bonding process. The ribbon is then broken off at this point from the supply and subsequently connected between the support member and pad 26 to form the ribbon 23.

Alternatively the ribbons 22, 23 are first bonded to the contacts 25, 26 on the silicon chip 24 using the wire wedge bonding technique and the free ends of the ribbons temporarily bonded to the support member 20. The method of ribbon or wire attachment for both the long and short term bonds may take the form of welding using ultrasonic energy or heat, soldering or adhesives.

The use of ultrasonic wedge bonding causes relatively less spread in the ribbons at the point of connection than with other forms of wire bonding. With ribbons of gold, aluminium-1% silicon, or copper, with ribbons nominally 30$\mu$ wide, the spreads with good bonding are of the order of 3–5$\mu$, 4–7$\mu$ and 3–9$\mu$, respectively.

Figure 4A:
FIG. 4A shows 25 $\mu$m diameter Al-1%Si wire ultrasonically bonded to Al thin film on silicon and polyetheretherketone (PEEK)

Experiments have been carried out to confirm the practicality of bonding metal wires and ribbons between the silicon chip and plastics support member. Thus, FIG. 4A illustrates a number of 25 micron diameter Al-1%Si wires 30 extending between a silicon surface 31 and PEEK material 32 which could constitute a suitable material for the support member 20.

Figure 4B:
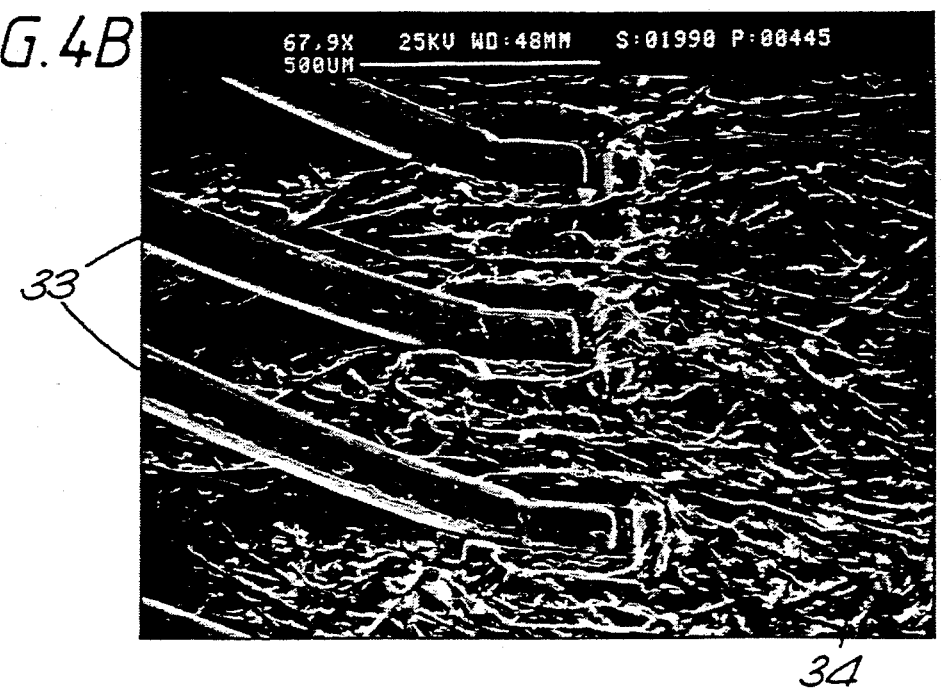
FIG. 4B shows 125 $\mu$m diameter Al-1%Si wire ultrasonically bonded to polyphenylene sulphide (PPS)

FIG. 4B shows in more detail the bonding of 125 micron diameter wires 33 to a PPS substrate 34.

Figure 4C:
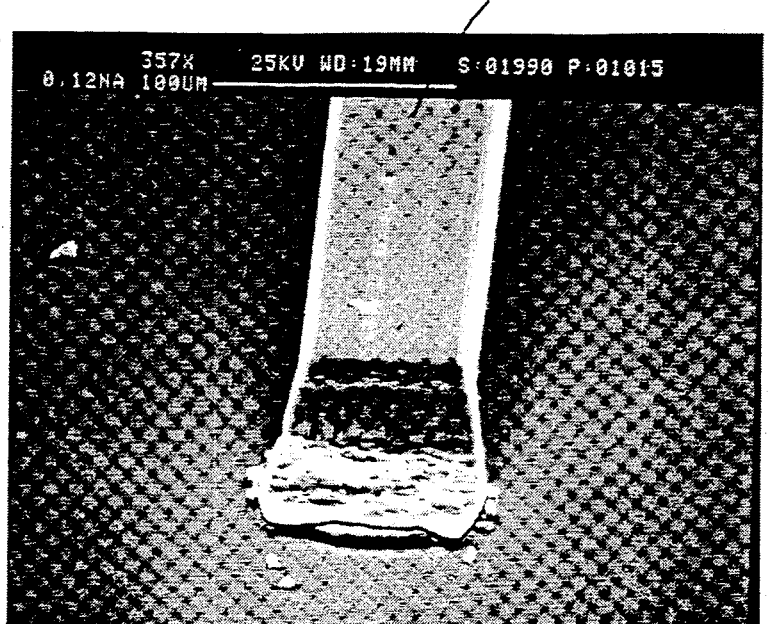
FIG. 4C shows 75×25 $\mu$m Al-1%Si ribbon ultrasonically bonded to polyimide tape.
Figure 4D:
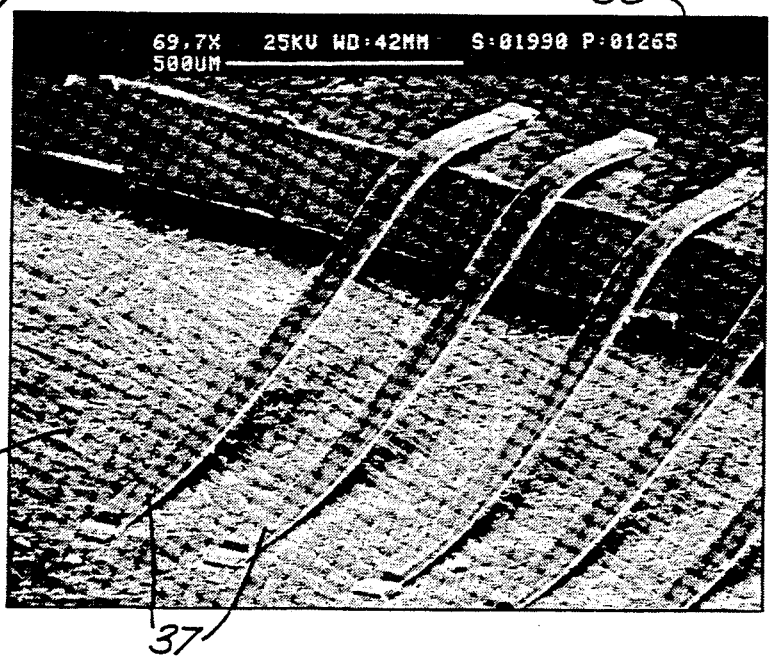
FIG. 4D shows 75×25 $\mu$m Al$\mu$1%Si ribbon ultrasonically bonded to Al thin film and silicon and polyphenylene sulphide (PPS)

FIG. 4C illustrates the bonding of a ribbon 35 to polyimide tap 36. FIG. 4D illustrates the bonding of ribbons 37 between silicon 38 and a PPS substrate 39.

Although the (temporary) bonds to the support member 20 can be sufficiently strong by themselves, it is sometimes necessary to reinforce the bonds by bonding a cap or lid to entrap the ribbons on to the support. For example a thermoset plastic base such as glass reinforced polyimide with a short glass fibre reinforced thermoplastic cover plate such as polyarylamide (PAM) can be used.

Figure 5A:
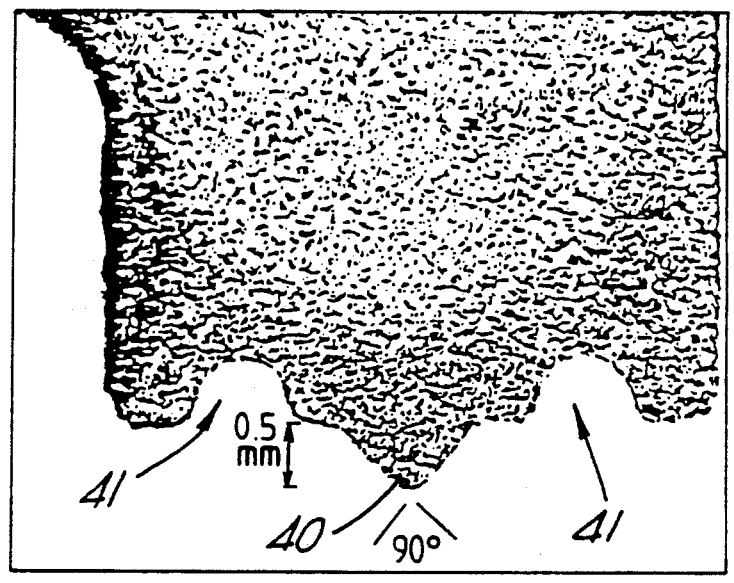
FIG. 5a is a cross-section through a skirt of a cap.

FIG. 5a is a transverse section through the depending skirt of a cover plate, cap or lid prior to bonding. This skirt or contact edge of the cover plate is suitably shaped in cross section to provide a narrow projecting zone 40 together with adjoining recesses 41 to facilitate bonding of the plastics materials. The projection profile 40 serves as a so called energy concentrator, while the recesses 41 serve to retain the excess material (flash) squeezed out during the lid bonding operation.

Figure 5B:
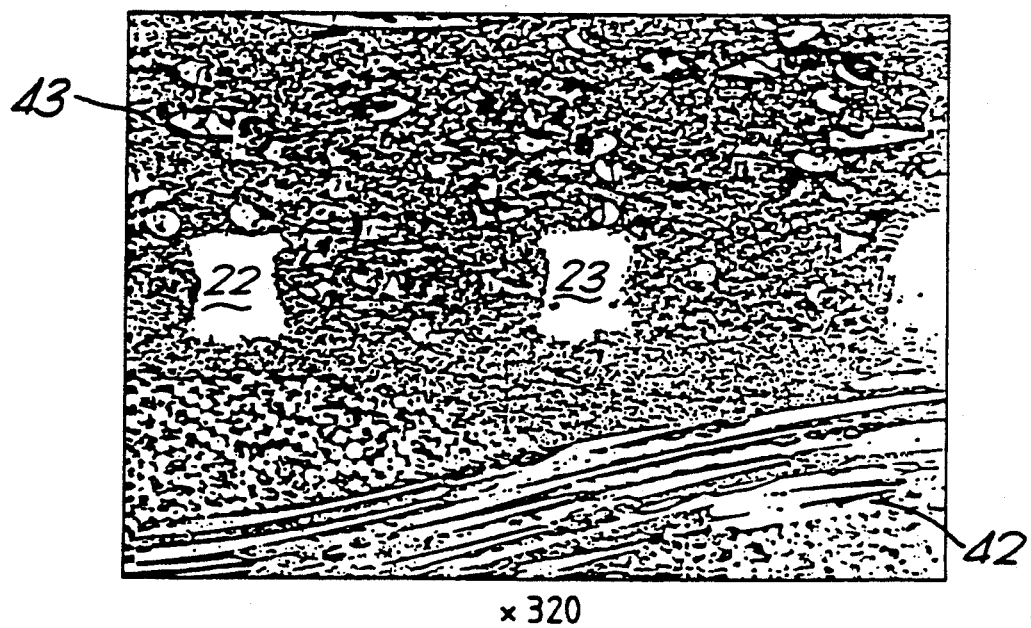
FIG. 5b is a longitudinal section through a polyarlyamide cap bonded copper tracks on a polymide substrate.

FIG. 5b shows a pair of copper conductor ribbons 22, 23 mounted on a polyimide substrate constituting a support member 42, and held by a cover plate 43 which lies across the ribbons, the thermoplastic having become moulded around the conductors during the bonding operation to be in close contact with the substrate (thermoset plastic). Here, although a true bond is not obtained between the thermoplastic and thermoset plastic materials, there is sufficient mechanical interlock to provide adequate support to the wire or ribbon interconnections. Also, the chip can be electrically tested at this point with the connecting leads mounted on the temporary substrate.

While coupled to the support member 20, the chip 24 can be handled for testing and the like without risk of damage. Finally, the ribbons 22, 23 are severed along lines 22' and 23' to release the chip 24 for subsequent attachment to a host device.

I claim:

1. A method of bonding an electrical conductor to a contact of an integrated circuit device comprising bonding a conductor to a support member and to a contact of an integrated circuit device; and subsequently severing said bonded conductor to release said integrated circuit device and the bonded conductor from said conductor support member.

2. A method according to claim 1, wherein said integrated circuit device comprises a silicon chip.

3. A method according to claim 1, wherein said conductor is in the form of one of a wire and ribbon.

4. A method according to claim 1, wherein said conductor is first bonded to said support member and the free end subsequently joined to said circuit device.

5. A method according to claim 4, wherein said conductor is broken off beyond the bond with said integrated circuit device.

6. A method according to claim 1, wherein the bonding steps are carried out using a wedge bonding technique.

7. A method according to claim 1, wherein the temporary bonds on the support member are reinforced by bonding a cap or lid to entrap said conductor on the support member.

8. A method according to claim 1, wherein said conductor is in the form of a rectangular ribbon.

9. A method according to claim 1, wherein subsequent to said severing step, the integrated circuit device is connected to a host device via the severed conductor.

* * * * *